United States Patent
Umeda et al.

(10) Patent No.: US 7,824,957 B2
(45) Date of Patent: Nov. 2, 2010

(54) METHOD FOR PRODUCING SEMICONDUCTOR DEVICE

(75) Inventors: Kenichi Umeda, Ashigarakami-gun (JP);
Atsushi Tanaka, Ashigarakami-gun (JP);
Kohei Higashi, Ashigarakami-gun (JP);
Maki Nangu, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/475,104

(22) Filed: May 29, 2009

(65) Prior Publication Data

US 2009/0298226 A1    Dec. 3, 2009

(30) Foreign Application Priority Data

May 30, 2008    (JP)    ............... 2008-143253

(51) Int. Cl.
*H01L 21/423*    (2006.01)
(52) U.S. Cl. .................. 438/104; 257/E21.475
(58) Field of Classification Search .............. 438/104; 257/43, E21.475
See application file for complete search history.

(56) References Cited

FOREIGN PATENT DOCUMENTS

| JP | 05-330823 A | 12/1993 |
|----|-------------|---------|
| JP | 2007-142196 A | 6/2007 |

OTHER PUBLICATIONS

Chiu, T., Tonooka, K., & Kikuchi, N. (2008). Fabrication of ZnO and CuCrO-2:Mg thin films by pulsed laser deposition with in situ laser annealing and its application to oxide diodes. Thin Solid Films, 516(18), doi: http:/dx.doi.org/10.1016/j.tsf.2007.10.067.*

* cited by examiner

*Primary Examiner*—W. David Coleman
*Assistant Examiner*—Daniel Shook
(74) *Attorney, Agent, or Firm*—Sughrue Mion, PLLC

(57) ABSTRACT

During a process of forming an active layer of a semiconductor device using a ZnO film, the ZnO film is laser-annealed with an ultraviolet pulsed laser to reduce the resistance of the film, and then oxidation treatment is applied to increase the specific resistance value at a channel portion of the ZnO film, which once has excessively low resistance after the laser annealing, to $10^3 \Omega \cdot \text{cm}$ or more.

15 Claims, 3 Drawing Sheets

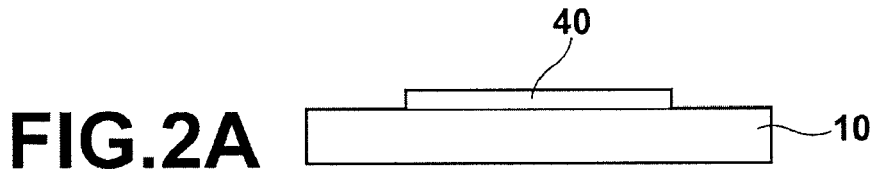
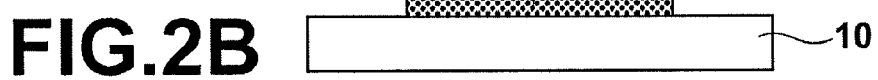
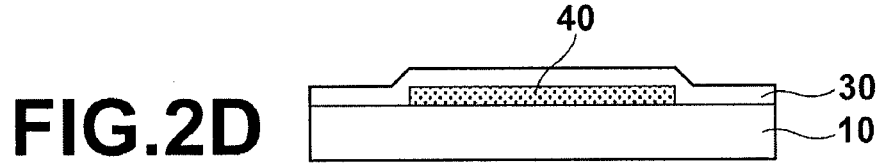
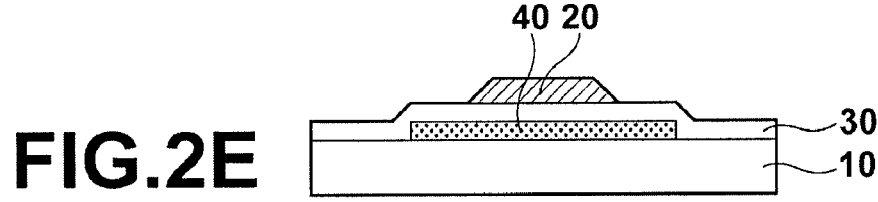
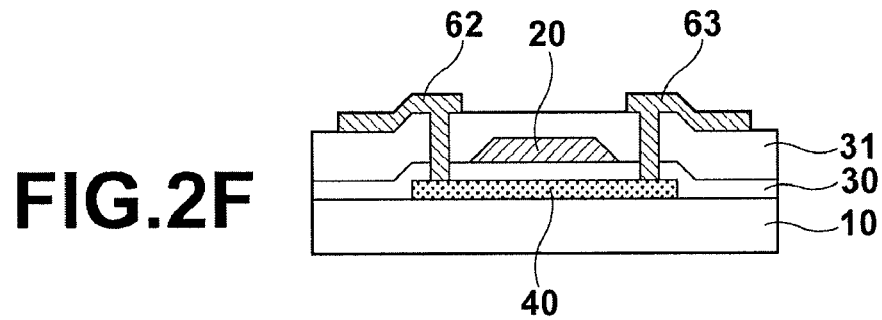

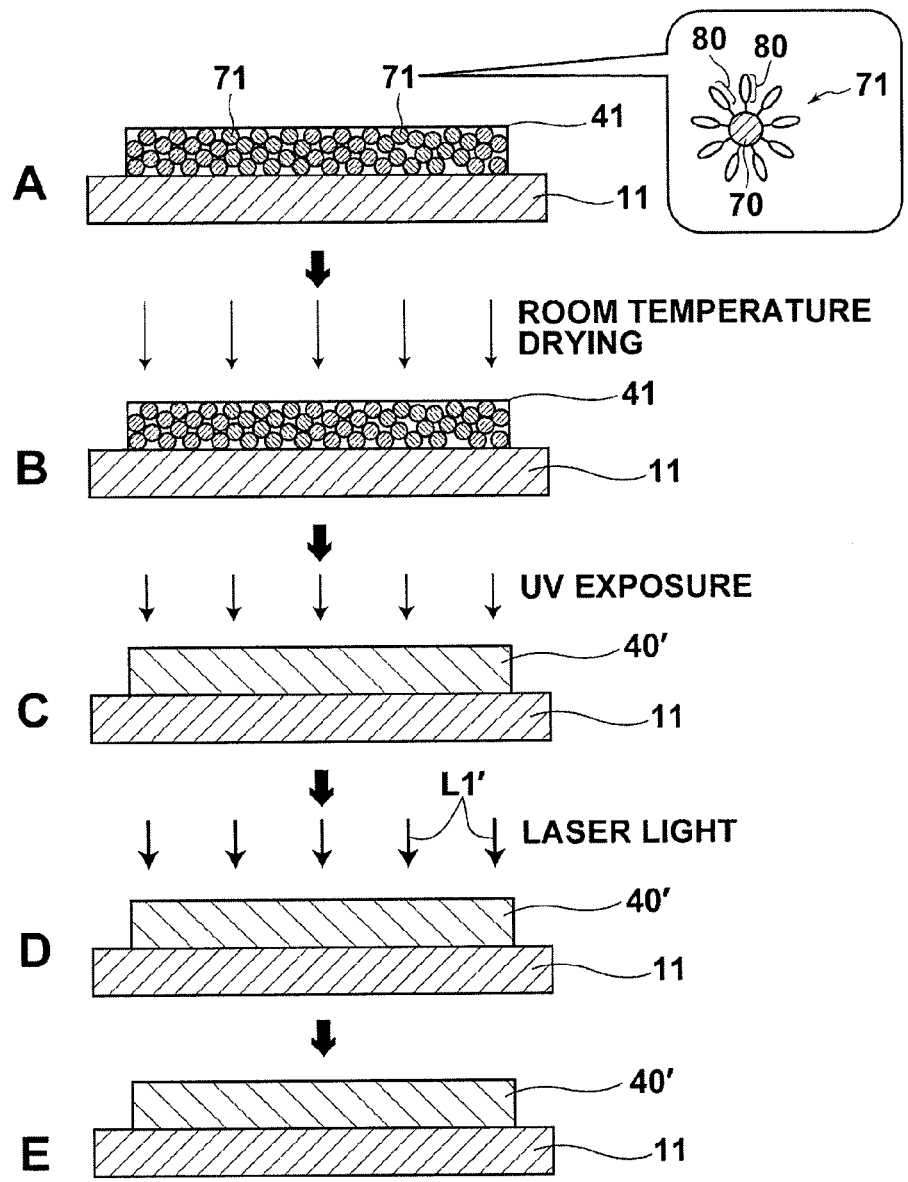

METHOD FOR PRODUCING SEMICONDUCTOR DEVICE

BACKGROUND OF THE INVENTION

1. Field of the Invention

The present invention relates to a method for producing a semiconductor device, and in particular to a method for producing a semiconductor device utilizing control of a specific resistance value of a semiconductor film through oxidation treatment or heat treatment.

2. Description of the Related Art

In recent years, various types of flexible devices are receiving attention along with appearance of oxide semiconductors, such as ZnO semiconductors. The flexible devices have various uses, such as electronic paper and flexible displays. However, for the oxide semiconductors, a resistance reduction (high-density carrier generation) technique, such as doping (impurity implantation) used for Si semiconductors, has not been established. Therefore, it is difficult to produce a semiconductor device including an active layer formed of the oxide semiconductor film and having desired properties. In order to address this problem, various techniques have been used to control the specific resistance value of the oxide semiconductor film by applying a post treatment to improve properties of the semiconductor device. For example, Japanese Unexamined Patent Publication No. 2007-142196 teaches to apply heat treatment at 500° C. to the oxide semiconductor film.

With the technique disclosed in the above patent document, however, it is impossible to produce a semiconductor device using a plastic substrate, for example. This is because that the structure of a flexible device basically includes a crystalline semiconductor or a metal film patterned on a flexible substrate, such as a resin substrate. Since the flexible substrates have a lower heat resistance than that of inorganic substrates, such as glass substrates, it is necessary to carry out the entire production process of the flexible device at a temperature not higher than the operating temperature limit of the substrate. The operating temperature limit of a resin substrate, for example, is usually 150-200° C., although depending on the material. Even a material having a relatively high heat resistance, such as polyimide, has the operating temperature limit of at most about 300° C.

Therefore, as the above-mentioned post treatment, use of laser annealing has been considered. In the laser annealing, high energy pulsed light, such as an excimer laser, is applied to a sample to instantaneously fuse and crystallize a semiconductor material. Thus, the specific resistance value of the oxide semiconductor film can be controlled without affecting the substrate.

In a case of a ZnO film, however, if the post treatment by laser annealing using the excimer laser is applied, the resulting ZnO film has excessively low resistance, and it is impossible to use the ZnO film as the active layer of the semiconductor device.

SUMMARY OF THE INVENTION

In view of the above-described circumstances, the present invention is directed to providing a method for producing a semiconductor device, which allows control of a specific resistance value of a ZnO film once having excessively low resistance through a post treatment using laser annealing, to use the ZnO film as an active layer of a semiconductor device.

In order to achieve the above-described object, the present inventors focused on the fact that the specific resistance value of the ZnO film, which once has excessively low resistance, can be controlled by applying oxidation treatment, thereby achieving the invention.

Namely, an aspect of the method for producing a semiconductor device according to the invention is a method for producing a semiconductor device, the semiconductor device including a structure formed on a substrate, the structure including a gate insulation layer disposed between a gate electrode and a semiconductor active layer, and a source electrode and a drain electrode formed to connect to the semiconductor active layer, the method including a step of forming the semiconductor active layer, the step including: a first step of forming a ZnO film on the gate insulation film or on the substrate; a second step of applying an ultraviolet pulsed laser to substantially the entire ZnO film to change a specific resistance value of the ZnO film at a region exposed to the pulsed laser to $10^2 \Omega \cdot cm$ or less; and a third step of applying oxidation treatment to a portion of the region exposed to the pulsed laser, the portion including the active layer, to change the specific resistance value of the semiconductor active layer at the portion subjected to the oxidation treatment to $10^3 \Omega \cdot cm$ or more, the first to third steps being carried out in this order.

The "ZnO film" herein refers to a metal oxide film which contains zinc oxide as the main component. It should be noted that, containing zinc oxide as the "main component" herein means that the content of components other than zinc oxide is 10% or less in molar ratio.

The ZnO film in the first step may be formed by any of various methods, such as a liquid phase method using a material liquid for forming the ZnO film or a dry process which does not use the material liquid. Subsequently, a treatment, such as heating or laser annealing, may be carried out. That is, in the invention, a treatment, such as heating or laser annealing, may be carried out before the second step. The method used for forming the film is not particularly limited, and any of various methods, such as coating, vapor deposition, sputtering and CVD, may be used as appropriate.

In the invention, the ZnO film may be formed by a liquid phase method using a material liquid, which contains an organic solvent and at least one material selected from the group consisting of an inorganic material, an organic precursor material and an organic-inorganic composite precursor material. The liquid phase method is not particularly limited, and may, for example, be a sol-gel method, a mist method or a later-described nanoparticulation process.

The "inorganic material" herein refers, for example, to a particle containing constituent elements of the ZnO film. The inorganic material is a material that forms a part of the ZnO film through oxidation treatment or heat treatment and can serve as a crystal nucleus for crystal growth.

The "organic precursor material" herein refers, for example, to a compound, such as metal alkoxide, which contains the constituent elements of the ZnO film. By applying oxidation treatment or heat treatment to the organic precursor, the constituent elements become a part of the ZnO film. On the other hand, by heating and stirring the organic precursor, a part of the organic precursor is particulated to form the inorganic material.

The "organic-inorganic composite precursor material" herein refers to a particle which is formed in the course of particulation of the organic precursor, and contains an organic substance and an inorganic substance in an intermediate state of the particulation reaction.

As described above, the inorganic material, the organic precursor material and the organic-inorganic composite precursor material respectively contain the constituent elements of the ZnO film.

In the third step, the specific resistance value may be changed to $10^4 \Omega \cdot cm$ or more.

Further, the oxidation treatment may include applying, under the presence of oxygen, at least one treatment selected from the group consisting of oxygen radial treatment and heat treatment carried out at a temperature not higher than 150° C. In this case, the oxygen radial treatment may be UV ozone treatment or plasma treatment.

The pulsed laser may have a pulse half-width of 100 ns or less, and the pulsed laser may be an excimer laser using any mixed gas selected from the group consisting of ArF, KrF and XeCl.

The substrate may be a flexible substrate formed of a resin.

BRIEF DESCRIPTION OF THE DRAWINGS

FIGS. 2A-2F are schematic sectional views illustrating the steps of a method for producing a semiconductor device according to a second embodiment, and FIG. 3 is a schematic sectional view illustrating an example of film formation using a sol-gel method.

DESCRIPTION OF THE PREFERRED EMBODIMENTS

Hereinafter, embodiments of the present invention will be described by way of example with reference to the drawings, which are not intended to limit the invention.

First Embodiment

FIGS. 1A-1F are schematic sectional views illustrating the production flow of a method for producing a semiconductor device according to a first embodiment.

Figure 1A:
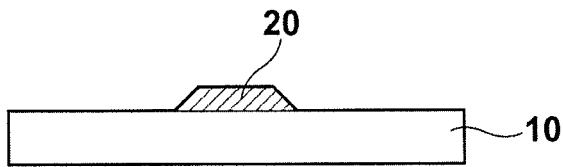
FIGS. 1A-1F are schematic sectional views illustrating the steps of a method for producing a semiconductor device according to a first embodiment.
Figure 1B:
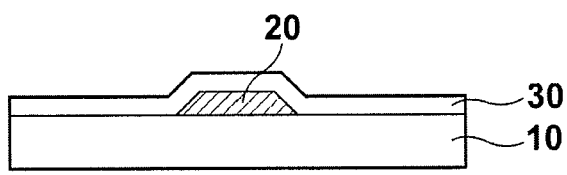
Figure 1C:
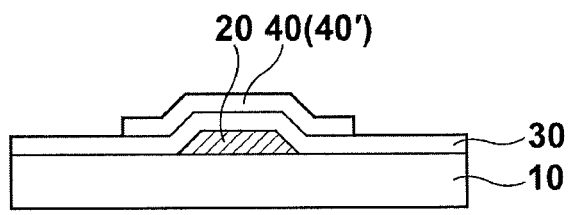
Figure 1D:
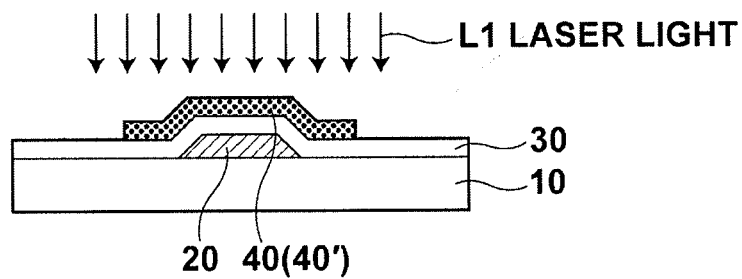
Figure 1E:
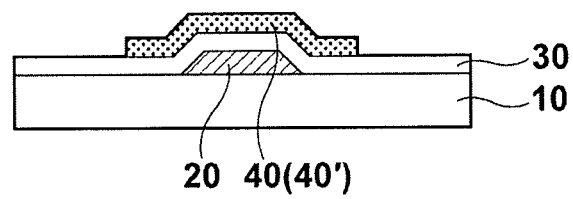
Figure 1F:
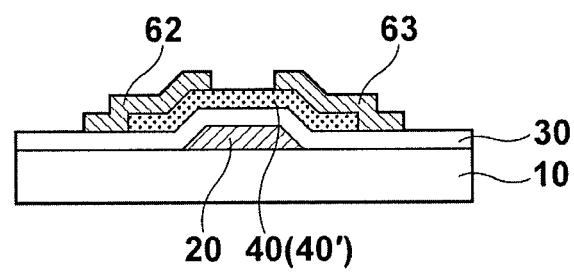

As shown in the drawings, in the method for producing a semiconductor device according to this embodiment, a patterned gate electrode 20 is formed on a substrate 10 (FIG. 1A), a gate insulation film 30 is formed (FIG. 1B), a ZnO film 40 is formed using a physical film formation technique so that the ZnO film 40 is positioned above the gate electrode 20 (FIG. 1C), and the ZnO film 40 is annealed with an ultraviolet pulsed laser L1 to improve the crystallinity at the annealed region of the ZnO film 40 and reduce the specific resistance value at the region to $10^2 \Omega \cdot cm$ or less (FIG. 1D). Thereafter, oxidation treatment is applied to the ZnO film 40 to increase the specific resistance value of the active layer to $10^3 \Omega \cdot cm$ or more (FIG. 1E). Then, a source electrode 62 and a drain electrode 63 are formed to connect to the ZnO film 40 (FIG. 1F).

The semiconductor device (FIG. 1F) produced according to this production method is a bottom gate thin film transistor (TFT).

The type of the substrate 10 is not particularly limited, and may be any substrate, such as a glass substrate or a flexible substrate. However, in view of flexibility, durability, heat resistance, etc., a flexible substrate formed of a resin, such as polyethylene terephthalate (PET), polyethylene naphthalate (PEN), polyimide (PI) or polyethersulfone (PES), may be used as the substrate 10. It should be noted that, if a flexible substrate is used, a process temperature of not higher than 200° C., or optionally not higher than 150° C., may be used in order to prevent thermal deformation of the substrate.

The gate electrode 20 preferably has excellent conductivity, and may be formed, for example, of Al, Cu, Ag, Au, Pt or an alloy thereof. Alternatively, the gate electrode 20 may be formed of a conductive oxide film, such as ITO (indium tin oxide).

The gate insulation film 30 may be formed of a silicon oxide or silicon nitride, such as $SiO_2$, $SiN_x$ or $SiO_xN_y$, or a metal oxide, such as $Al_2O_3$, $TiO_2$, $ZrO_2$ or $Y_2O_3$, in view of insulation and dielectric properties, and in particular, a silicon oxide or a silicon nitride may be used. The film thickness of the gate insulation film 30 may be selected as appropriate depending on various conditions, and may be in the range from about 50 to 500 nm.

The film thickness of the ZnO film 40 may be selected as appropriate depending on various conditions, and may be in the range from about 20 to 500 nm. The physical film formation technique used for forming the ZnO film 40 is not particularly limited, and any of various methods, such as vapor deposition, sputtering and CVD, may be used as appropriate.

The ultraviolet pulsed laser L1 has a wavelength within a band of about 150 nm to 350 nm, and may, for example, be a XeCl excimer laser ($\lambda$=308 nm), a KrF excimer laser ($\lambda$=248 nm) or an ArF excimer laser ($\lambda$=193 nm). The pulsed laser may have a pulse half-width of 100 ns or less, or optionally several ten nanoseconds or less.

The oxidation treatment is not particularly limited as long as it can oxidize the active layer portion of the ZnO film 40, however, may be at least one treatment selected from the group consisting of oxygen radial treatment and heat treatment carried out at a temperature not higher than 150° C., which is carried out under the presence of oxygen. In this case, the oxygen radial treatment may be UV ozone treatment or plasma treatment. A light source for emitting ultraviolet light used in the UV ozone treatment may, for example, be a low pressure Hg lamp or a Xe excimer lamp.

The heat treatment is carried out under the conditions of heating time of 10 minutes to 6 hours and heating temperature not higher than 150° C., optionally from room temperature to 150° C., or further optionally from 100 to 150° C. However, if the substrate is a resin substrate, the heating temperature may be selected as appropriate within the temperature range not higher than the operating temperature limit of the resin substrate. For example, in a case of a ZnO film formed by coating an alkoxide solution and subsequently applying ultraviolet laser light, the specific resistance value of the film can be increased from $6.0 \times 10^{-3} \Omega \cdot cm$ to $5.2 \times 10^3 \Omega \cdot cm$ by applying the heat treatment at 200° C. for 30 minutes in the atmosphere.

The UV ozone treatment may be carried out using a low-pressure Hg lamp ($\lambda$=185 nm, 254 nm) under the condition of about 3 minutes to 3 hours, and the above-described heat treatment may be used in combination. In particular, it is more effective to simultaneously carry out the UV ozone treatment and the heat treatment. For example, effective oxidation treatment can be achieved by carrying out the UV ozone treatment for 90 minutes using the low-pressure Hg lamp, and simultaneously carrying out the heat treatment at 150° C. for 60 minutes. In this case, it suffices that the 60 minutes of heat treatment maintained at 150° C. is included in the 90 minutes of UV ozone treatment.

The plasma treatment may be carried out using $O_2$ plasma under the conditions of about 50-300 Pa, 100-1000 W, and 30 seconds to 2 hours. Similarly to the UV ozone treatment, the above-described heat treatment may be used in combination. In particular, it is more effective to simultaneously carry out the plasma treatment and the heat treatment. For example, effective oxidation treatment can be achieved by simultaneously carrying out the plasma treatment using $O_2$ plasma under the conditions of 100 Pa, 500 W, and 20 minutes and the heat treatment under the conditions of 150° C. and 30 minutes. Similarly to the above-described case, it suffices that the 20 minutes of plasma treatment is included in the 30 minutes of heat treatment maintained at 150° C.

It is not necessary to apply the oxidation treatment to the entire ZnO film 40. It suffices that the oxidation treatment is applied to at least a region, which is used as the active layer, of the ZnO film 40 to increase the specific resistance value at the region.

The source electrode 62 and the drain electrode 63 preferably have excellent conductivity, and may be formed, for example, of Al, Cu, Ag, Au, Pt, or an alloy thereof. Alternatively, the source electrode 62 and the drain electrode 63 may be formed of a conductive oxide film, such as ITO (indium tin oxide).

In the method for producing a semiconductor device according to the invention, the formed ZnO film 40 is subjected to the laser annealing using the ultraviolet pulsed laser L1 to improve the crystallinity of the film. However, after the laser annealing, the specific resistance value of the ZnO film 40 is excessively reduced to $10^2 \Omega \cdot cm$ or less. The principle of this resistance reduction is that oxygen deficiency is generated in the ZnO film 40 by applying the short wavelength light to the ZnO film 40. Thus, carrier electrons are generated and the movable carrier density in the ZnO film 40 increases. This effect is equivalent to increasing the carrier electrons by doping an n-dopant to a Si semiconductor film.

Subsequently, the oxidation treatment is applied to the ZnO film 40 to increase the specific resistance value at the active layer portion to $10^3 \Omega \cdot cm$ or more, or optionally to $10^4 \Omega \cdot cm$ or more. In this case, the upper limit of the specific resistance value may be $10^9 \Omega \cdot cm$, or optionally $10^8 \Omega \cdot cm$. The principle of this resistance increase is that the oxygen deficiency generated in the ZnO film 40 is filled by the oxidation, i.e., this is an inverse phenomenon of the principle of the resistance reduction. Thus, the carrier electrons disappear and the movable carrier density in the ZnO film 40 decreases.

The reasons for setting the above-described lower and upper limit values are as follows. In the invention, the definition of "operation as a thin film transistor" is that at least an $I_{on}/I_{off}$ ratio of at least in double digits is provided. Therefore, the lower limit value of the specific resistance value is $10^3 \Omega \cdot cm$ or more. The $I_{on}/I_{off}$ ratio may optionally be at least in quadruple digits, and in this case, the lower limit value of the specific resistance value is $10^4 \Omega \cdot cm$ or more. On the other hand, the upper limit value of about $10^8$-$10^9 \Omega \cdot cm$ is set because, if the specific resistance value is excessively high, the ZnO film 40 becomes an insulation film.

In this manner, the active layer suitable for use in a TFT can be produced using the ZnO film 40. Further, according to the method for producing a semiconductor device of the invention, a high quality crystal is once produced through the laser annealing, and then the oxidation treatment is carried out. Therefore, a low temperature production process can be used while maintaining the high quality crystal and good properties of the semiconductor device.

Moreover, according to the method for producing a semiconductor device of the invention, the specific resistance value can be controlled through only the treatments, such as the laser annealing, the heat treatment and the oxygen radial treatment. Therefore, no complicated production process, such as ion doping typically used for silicon semiconductors, is necessary, thereby simplifying the semiconductor device production process.

Second Embodiment

FIGS. 2A-2F are schematic sectional views illustrating the production flow of a method for producing a semiconductor device according to a second embodiment. The semiconductor device produced in this embodiment (FIG. 2F) is a top gate TFT. The other features are the same as the first embodiment, and therefore, description of the same features as the first embodiment shown in FIGS. 1A-1F is omitted unless it is necessary.

As shown in the drawings, in the method for producing a semiconductor device according to this embodiment, the ZnO film 40 is formed on the substrate 10 by using a physical film formation technique (FIG. 2A), and the ZnO film 40 is annealed with the ultraviolet pulsed laser L1 to improve the crystallinity and reduce the specific resistance value to $10^2 \Omega \cdot cm$ or less at the annealed region of the ZnO film 40 (FIG. 2B). Thereafter, the oxidation treatment is applied to the ZnO film 40 to increase the specific resistance value at active layer to $10^3 \Omega \cdot cm$ or more (FIG. 2C). Then, the gate insulation film 30 is formed (FIG. 2D), the patterned gate electrode 20 is formed to be positioned above the ZnO film 40 (FIG. 2E), an interlayer insulation film 31 is formed, and the source electrode 62 and the drain electrode 63 are formed to connect to the ZnO film 40 via contact holes formed in the interlayer insulation film 31 (FIG. 2F).

Similarly to the gate insulation film 30, the interlayer insulation film 31 may be formed, for example, of a silicon oxide or a silicon nitride, such as $SiO_2$, $SiN_x$ or $SiO_xN_y$, or a metal oxide, such as $Al_2O_3$, $TiO_2$, $ZrO_2$ or $Y_2O_3$, in view of insulation and dielectric properties, and in particular, a silicon oxide or a silicon nitride may be used. The film thickness of the interlayer insulation film 31 may be selected as appropriate depending on various conditions, and may be in the range from about 100-1000 nm.

The contact holes may be formed by etching, such as dry etching or wet etching.

In this embodiment, the oxidation treatment is carried out after the post treatment using the laser annealing, similarly to the first embodiment. Thus, the specific resistance value of the ZnO film, which has once been excessively reduced by the post treatment using the laser annealing, can be increased.

In this manner, the active layer suitable for use in a TFT can be produced using the ZnO film 40.

As described above, the same effect as that of the first embodiment can be obtained in this embodiment.

Third Embodiment

A method for producing a semiconductor device according to a third embodiment is the same as the method of the first embodiment except that a liquid phase method is used for forming the ZnO film 40. In the liquid phase method, a material liquid which contains an organic solvent and at least one material selected from the group consisting of an inorganic material, an organic precursor material and an organic-inorganic composite precursor material is used. The other features are the same as the first embodiment, and therefore, description of the same features as the first embodiment shown in FIGS. 1A-1F is omitted unless it is necessary. It should be noted that, the structure of the semiconductor device in this embodiment is the same as that shown in FIGS. 1A-1F, and therefore, the liquid phase method is described with reference to FIGS. 1A-1F, where the ZnO film formed by coating is referred to as a ZnO coated film 40'.

In the method for producing a semiconductor device according to this embodiment, the patterned gate electrode 20 is formed on the substrate 10, the gate insulation film 30 is formed, the ZnO coated film 40' is formed by the liquid phase method to be positioned above the gate electrode 20, and the ZnO coated film 40' is annealed with the ultraviolet pulsed laser L1 to improve the crystallinity and reduce the specific resistance value to $10^2 \Omega \cdot cm$ or less at the annealed region of the ZnO coated film 40'. Thereafter, the oxidation treatment is applied to the ZnO coated film 40' to increase the specific resistance value at the active layer to $10^3 \Omega \cdot cm$ or more. Then, the source electrode 62 and the drain electrode 63 are formed to connect to the ZnO coated film 40'.

The liquid phase method is not particularly limited, and examples thereof may include a sol-gel method and a mist method. In view of ease of film formation and device costs, the sol-gel method may be used.

In the sol-gel method, an alcohol solution (sol) of a metal alkoxide is used as a starting material, and a jelly-like solid (gel) is formed from the solution through chemical reactions, such as hydrolysis and polycondensation. The obtained solid is further subjected to heat treatment to remove the remaining solvent and densify the solid to obtain a formed product. The sol-gel method is advantageous, for example, in providing easy control of film thickness and shape of the thin film, allowing the film formation at the room temperature and therefore not necessitating large equipment, being applicable to large area devices, allowing the film formation at a low temperature and consuming lower energy.

The method used for forming the ZnO coated film 40' may, for example, be a liquid phase method including steps (A)-(C) described below.

<Step (A)>

On the surface of the substrate 11, on which the ZnO coated film 40' is to be formed, the material liquid, which contains an organic solvent and a material containing elements forming the ZnO coated film 40' (hereinafter referred to as constituent elements of the ZnO coated film) is coated to form a thin film precursor 41 containing all the constituent elements of the ZnO coated film 40' ("A" in FIG. 3).

It should be noted that, in this step, most of the organic component in the thin film precursor 41 may be removed by room-temperature drying, or the like, as shown at "B" in FIG. 3. Further, in this step, some heating may be carried out within a range where the crystallization does not progress (for example, at around 50° C.).

The method used for coating the material liquid is not particularly limited, and examples thereof include various coating methods, such as spin coating and dip coating, and printing techniques, such as inkjet printing and screen printing. Using the printing technique, such as inkjet printing or screen printing, a desired pattern can directly be formed.

The type of the substrate 11 is not particularly limited, and examples thereof include a resin substrate, a glass substrate and a silicon substrate. In the sol-gel method, the conductive inorganic film having low resistance can be formed by a relatively low temperature process which is carried out at a temperature not higher than the operating temperature limit of the resin substrate. Therefore, the sol-gel method is applicable to a resin substrate having an operating temperature limit of 200° C. or less, or even 150° C. or less. As the resin substrate, resin substrates, such as polyethylene terephthalate (PET), polyethylene naphthalate (PEN) and polyimide (PI) have preferably been used. Inexpensive PET or PEN having an operating temperature limit of 200° C. or less may be used. Other examples of the usable resin substrate may include polycarbonate (PC), polyarylate (PAR), aromatic polyether ketone (PEEK), aromatic polyether sulfone (PES), wholly aromatic polyketone, cyclic olefin polymer and liquid crystal polymer.

In step (A), the material liquid may contain an organic precursor material (material II) and the organic solvent. The material II may, for example, be a metal alkoxide compound.

Alternatively, the material liquid may contain an inorganic material (material I) and/or an organic-inorganic composite precursor material (material III) and the organic solvent. The material liquid may be a dispersion liquid of a nanoparticle 70 and/or an organic-inorganic composite particle 71, which is obtained by preparing a solution containing the organic precursor material (material II) and the organic solvent, and then particulating the organic precursor material (material II) in the solution.

The method used for particulating the organic precursor material (material II) in the solution is not particularly limited, and, for example, heating and stirring may be used. In the case where the thin film precursor 41 is formed by the liquid phase method (nanoparticulation process) using the material liquid, the amount of organic component contained in the thin film precursor 41 decreases due to the particulation before film formation, and the nanoparticle 70 serves as a crystal nucleus for crystal growth in the later step (C) to facilitate the crystallization. When the nanoparticulation process is used, some portion of the organic precursor material (material II), which has not been particulated, may remain in the thin film precursor 41. The thin film precursor 41 is usually an amorphous film, however, when the nanoparticulation process is used, the nanoparticle 70 in the thin film precursor 41 may be crystalline.

<Step (B)>

The organic component contained in the thin film precursor 41 is decomposed (at "C" in FIG. 3) under the condition where the temperature is not higher than a decomposing temperature of at least one organic component contained in the thin film precursor 41 and not higher than the operating temperature limit of the substrate 11.

This step (B) is a pretreatment step before step (C) for crystallizing and satisfactorily densifying the ZnO coated film 40' to provide the ZnO coated film 40' having low resistance. The method used for decomposing the organic component contained in the thin film precursor 41 is not limited, and may, for example, be oxidation treatment using oxygen radial.

Examples of the oxygen radical treatment include a treatment to apply ultraviolet light having a wavelength of 300 nm or less under the presence of oxygen or ozone, or a treatment to apply oxygen plasma. The ultraviolet light having the wavelength of 300 nm or less may be ultraviolet light emitted from a light source such as a mercury lamp or an excimer lamp.

The method using oxygen radial provides efficient decomposition of the organic component and does not necessitate high temperature heating. By this pretreatment, the organic component contained in the thin film precursor 41 can be decomposed before the crystallization step. Thus, the amount of the organic component remaining in the thin film precursor 41 is sufficiently reduced, thereby minimizing ablation, etc., due to the remaining organic component in the subsequent sintering step (C) and allowing the sintered thin film precursor 41 to be satisfactorily densified to have low resistance. It should be noted that the oxidation treatment can also be achieved by heat treatment carried out under the presence of oxygen.

<Step (C)>

The thin film precursor 41 subjected to the pretreatment is crystallized ("D" in FIG. 3) to provide the ZnO coated film 40' ("E" in FIG. 3).

The crystallization is achieved by heating the thin film precursor 41 under the condition of temperature not lower than the crystallization temperature of the thin filmprecursor 41. The method used for crystallization is not limited, however, may be a method in which the crystallization is achieved by heat treatment using a heat ray. An example of the heat treatment using the heat ray may be laser annealing, which uses a laser beam L1' as the heat ray to anneal and densify the ZnO coated film 40' with the laser beam L1' being moved to scan the ZnO coated film 40'.

Since the laser annealing is a scanning-type heat treatment using a high-energy heat ray, it provides efficient crystallization. Further, the amount of energy reaching the substrate can be controlled by changing the laser exposure conditions, such as the scanning speed and the laser power. By determining the laser exposure conditions depending on the heat resistance of the substrate, the substrate temperature of not higher than the operating temperature limit of the substrate can be provided. Therefore, this method is advantageous when a resin substrate having low heat resistance is used.

A laser light source used for the laser annealing is not particularly limited, however, may be a pulsed laser, such as an excimer laser. In this case, a short-wavelength pulsed laser, such as an excimer laser, may be used, since the amount of energy absorbed at the film surface layer is large and the energy reaching the substrate can easily be controlled. For similar reasons, when the pulsed laser is used, the pulsed laser may have a short pulse width of 100 ns or less, or optionally several ten nanoseconds or less.

The above is the example of steps for forming the ZnO coated film 40' using the liquid phase method. It should be noted that, when the ZnO coated film is actually formed as the active layer of a semiconductor device using the sol-gel method, the ZnO coated film 40' shown in FIG. 1C is obtained by carrying out the above-described steps (A) and (B) on the substrate in the state shown in FIG. 1B, for example.

As described above, the same effect as that of the first embodiment can be obtained in this embodiment.

Japanese Unexamined Patent Publication No. 5 (1993)-330823 discloses a method in which a ZnO coated film is subjected to heat treatment at a temperature of 500° C. or more. However, this method cannot be used for producing a flexible device using a flexible substrate made of a resin. In contrast, the method for producing a semiconductor device according to this embodiment uses the laser annealing and the oxidation treatment which do not affect the substrate, and therefore, can be used for producing a flexible device at a temperature not higher than the operating temperature limit of the flexible substrate.

EXAMPLES

Example 1a

A ZnO film formed by sputtering (hereinafter referred to as a ZnO sputtered film) was exposed to 200 shots of KrF excimer laser having a pulse half-width of 20-30 ns and a wavelength of 248 nm, and X-ray evaluation was carried out before and after the laser annealing. The laser annealing with an energy density of 102 mJ/cm$^2$ provided the ZnO sputtered film having the highest crystallinity. The specific resistance value of the ZnO sputtered film after the laser annealing was 5.6×10$^{-3}$Ω·cm. Then, heat treatment was carried out at 150° C. for 30 minutes as the oxidation treatment immediately after the laser annealing. The specific resistance value at this time was 2.4×10$^3$Ω·cm. Further, TFT properties were evaluated using the ZnO sputtered film formed under these conditions. As a result, good properties were obtained, namely, the carrier mobility was 2.1 cm$^2$/V·s and the $I_{on}/I_{off}$ ratio was 10$^3$.

It should be noted that the structure of the TFT was the bottom gate TFT shown in FIG. 1F, and the TFT included, besides the ZnO film, a N+Si substrate, which also serves as a gate electrode, a gate insulation film formed of a Si thermal oxide film, and a source electrode and a drain electrode made of Ti.

Example 1b

The ZnO sputtered film was exposed to 200 shots of KrF excimer laser having a pulse half-width of 20-30 ns and a wavelength of 248 nm, in the same manner as in example 1a, and the X-ray evaluation was carried out before and after the laser annealing. This example is the same as example 1a except that heat treatment at 150° C. for 90 minutes and UV ozone treatment for 90 minutes were simultaneously carried out as the oxidation treatment, in place of the oxidation treatment achieved by the heat treatment in example 1a. The specific resistance value after the oxidation treatment was 5.5×10$^4$Ω·cm. Further, the TFT properties were evaluated in the same manner as in example 1a using the ZnO sputtered film formed under these conditions. As a result, good properties were obtained, namely, the carrier mobility was 3.4 cm$^2$/V·s and the $I_{on}/I_{off}$ ratio was 10$^5$.

Comparative Example 1

The ZnO sputtered film was exposed to 200 shots of KrF excimer laser having a pulse half-width of 20-30 ns and a wavelength of 248 nm, in the same manner as in example 1a, and the X-ray evaluation was carried out before and after the laser annealing. This example is the same as example 1a except that the oxidation treatment was not carried out. The specific resistance value after the laser annealing was 5.6×10$^{-3}$Ω·cm. Further, the TFT properties were evaluated in the same manner as in example 1a using the ZnO sputtered film formed under these conditions. As a result, the operation as a TFT was not obtained.

<Evaluation 1>

From examples 1a and 1b and comparative example 1, it was confirmed that the active layer suitable for use in a TFT can be formed using the ZnO sputtered film by increasing the resistance of the ZnO film, which has once been reduced to around 10$^{-3}$Ω·cm, to 10$^3$Ω·cm or more through the oxidation treatment.

Example 2a 2.14 g of zinc acetate dihydrate was measured, and stirred in diethylethanolamine at a temperature of 130° C. to obtain a pale yellow material liquid 1. A ZnO film (hereinafter referred to as a ZnO coated film) was formed by the sol-gel method using the material liquid 1, and the ZnO coated film was exposed to 200 shots of KrF excimer laser having a pulse half-width of 20-30 ns and a wavelength of 248 nm. Then, the X-ray evaluation was carried out before and after the laser annealing. The laser annealing with an energy density of 163 mJ/cm$^2$ provided the ZnO coated film having the highest crystallinity. The specific resistance value of the ZnO coated film after the laser annealing was 1.2×10$^{-2}$Ω·cm. Then, heat treatment was carried out at 150° C. for 30 minutes as the oxidation treatment immediately after the laser annealing. The specific resistance value at this time was 1.5×10$^3$Ω·cm. Further, the TFT properties were evaluated in the same manner as in example 1a using the ZnO coated film formed under these conditions. As a result, good properties were obtained, namely, the carrier mobility was 0.3 cm$^2$/V·s and the $I_{on}/I_{off}$ ratio was 10$^2$.

Example 2b

The ZnO coated film was exposed to 200 shots of KrF excimer laser having a pulse half-width of 20-30 ns and a wavelength of 248 nm, in the same manner as in example 2a, and the X-ray evaluation was carried out before and after the laser annealing. This example is the same as example 2a except that heat treatment at 150° C. for 90 minutes and UV ozone treatment for 90 minutes were simultaneously carried out as the oxidation treatment, in place of the oxidation treatment achieved by the heat treatment in example 2a. The specific resistance value after the oxidation treatment was 2.2×10$^4$Ω·cm. Further, the TFT properties were evaluated in the same manner as in example 1a using the ZnO coated film formed under these conditions. As a result, good properties were obtained, namely, the carrier mobility was 0.2 cm$^2$/V·s and the $I_{on}/I_{off}$ ratio was 10$^4$.

As described above, it was confirmed that good transistor properties can be obtained by simultaneously applying the heat treatment and the UV ozone treatment after the laser annealing. Further, it was confirmed that, since the method of the invention does not necessitate high temperature heat treatment, the method is applicable even to a substrate having low heat resistance, such as a resin substrate. Moreover, it was confirmed that, since the film is formed by coating in the method of the invention, the method can be applied without damaging the resin substrate during film formation.

Comparative Example 2

The ZnO coated film was exposed to 200 shots of KrF excimer laser having a pulse half-width of 20-30 ns and a wavelength of 248 nm, in the same manner as in example 2a, and the X-ray evaluation was carried out before and after the laser annealing. This example is the same as example 2a except that the oxidation treatment was not carried out. The specific resistance value after the laser annealing was 1.2× 10$^{-2}$Ω·cm. Further, the TFT properties were evaluated in the same manner as in example 1a using the ZnO coated film formed under these conditions. As a result, the operation as a TFT was not obtained.

<Evaluation 2>

From examples 2a and 2b and comparative example 2, it was confirmed that the active layer suitable for use in a TFT can be formed using the ZnO coated film by increasing the resistance of the ZnO film, which has once been reduced to around 10$^{-2}$Ω·cm, to 10$^3$Ω·cm or more through the oxidation treatment.

Comparative Example 3

2.14 g of indium isopropoxide was measured, and stirred in diethylethanolamine at a temperature of 130° C. to obtain a pale yellow material liquid 2. An In$_2$O$_3$ film (hereinafter referred to as an In$_2$O$_3$ coated film) was formed by the sol-gel method using the material liquid 2, and the In$_2$O$_3$ coated film was exposed to 200 shots of KrF excimer laser having a pulse half-width of 20-30 ns and a wavelength of 248 nm. Then, the X-ray evaluation was carried out before and after the laser annealing. The laser annealing with an energy density of 128 mJ/cm$^2$ provided the In$_2$O$_3$ coated film having the highest crystallinity. The specific resistance value of the In$_2$O$_3$ coated film after the laser annealing was 2.3×10$^{-2}$Ω·cm. Then, heat treatment was carried out at 150° C. for 30 minutes as the oxidation treatment immediately after the laser annealing. The specific resistance value at this time was 1.5×10$^{-1}$Ω·cm. Further, the TFT properties were evaluated in the same manner as in example 1a using the In$_2$O$_3$ coated film formed under these conditions. As a result, the operation as a TFT was not obtained.

Comparative Example 4

The In$_2$O$_3$ coated film was exposed to 200 shots of KrF excimer laser having a pulse half-width of 20-30 ns and a wavelength of 248 nm, in the same manner as in comparative example 3, and the X-ray evaluation was carried out before and after the laser annealing. This example is the same as comparative example 3 except that heat treatment at 150° C. for 90 minutes and UV ozone treatment for 90 minutes were simultaneously carried out as the oxidation treatment, in place of the oxidation treatment achieved by the heat treatment in comparative example 3. The specific resistance value after the oxidation treatment was 3.6×10$^{-1}$Ω·cm. Further, the TFT properties were evaluated in the same manner as in example 1a using the In$_2$O$_3$ coated film formed under these conditions. As a result, the operation as a TFT was not obtained.

Comparative Example 5 the In$_2$O$_3$ coated film was exposed to 200 shots of KrF excimer laser having a pulse half-width of 20-30 ns and a wavelength of 248 nm, in the same manner as in comparative example 3, and the X-ray evaluation was carried out before and after the laser annealing. This example is the same as comparative example 3 except that the oxidation treatment was not carried out. The specific resistance value after the laser annealing was 2.3×10$^{-2}$Ω·cm. Further, the TFT properties were evaluated in the same manner as in example 1a using the In$_2$O$_3$ coated film formed under these conditions. As a result, the operation as a TFT was not obtained.

<Evaluation 3>

From all the above-described examples and the comparative examples, it was confirmed that the specific resistance value of the ZnO film can be controlled by the oxidation treatment, and that the specific resistance value of the In$_2$O$_3$ coated film cannot be controlled by the oxidation treatment.

A table containing these results is shown below.

| | Thin Film | Pulsed Laser Exposure Conditions | X-ray Peak Intensity (kcps) | | Oxidation Treatment | Specific Resistance After Treatment (Ω · cm) | TFT Properties | |
| --- | --- | --- | --- | --- | --- | --- | --- | --- |
| | | | Before Laser Annealing | After Laser Annealing | | | Mobility (cm$^2$/Vs) | $I_{on}/I_{off}$ |
| Example 1a | ZnO Sputtered Film | 102 mJ/cm$^2$ 200 shots | 531 (34.1°) | 2063 (34.1°) | 150° C. (30 minutes) | 2.4 × 10$^3$ | 2.1 | 10$^3$ |
| Example 1b | | | | | 150° C. (90 minutes) UV Ozone (90 minutes) | 5.5 × 10$^4$ | 3.4 | 10$^5$ |

-continued

| | Thin Film | Pulsed Laser Exposure Conditions | X-ray Peak Intensity (kcps) Before Laser Annealing | X-ray Peak Intensity (kcps) After Laser Annealing | Oxidation Treatment | Specific Resistance After Treatment ($\Omega \cdot cm$) | TFT Properties Mobility ($cm^2/Vs$) | $I_{on}/I_{off}$ |
|---|---|---|---|---|---|---|---|---|
| Comp. Example 1 | | | | | None | $5.6 \times 10^{-3}$ | Did not operate | |
| Example 2a | ZnO Coated film | 163 mJ/cm² 200 shots | No Peak | 1024 (34.1°) | 150° C. (30 minutes) | $1.5 \times 10^3$ | 0.3 | $10^2$ |
| Example 2b | | | | | 150° C. (90 minutes) UV Ozone (90 minutes) | $2.2 \times 10^4$ | 0.2 | $10^4$ |
| Comp. Example 2 | | | | | None | $1.2 \times 10^{-2}$ | Did not operate | |
| Comp. Example 3 | In₂O₃ Coated film | 128 mJ/cm² 200 shots | No Peak | 1563 (30.2°) | 150° C. (30 minutes) | $1.5 \times 10^{-1}$ | Did not operate | |
| Comp. Example 4 | | | | | 150° C. (90 minutes) UV Ozone (90 minutes) | $3.6 \times 10^{-1}$ | | |
| Comp. Example 5 | | | | | None | $2.3 \times 10^{-2}$ | | |

EFFECT OF THE INVENTION

According to the method for producing a semiconductor device of the invention, the specific resistance value of a ZnO film forming an active layer of a semiconductor device, which has been subjected to laser annealing and once has excessively low resistance, can be increased by applying oxidation treatment to the ZnO film. Thus, properties of the semiconductor device using the ZnO film as the active layer can be improved.

What is claimed is:

1. A method for producing a semiconductor device, the semiconductor device including a structure formed on a substrate, the structure including a gate insulation layer disposed between a gate electrode and a semiconductor active layer, and a source electrode and a drain electrode formed to connect to the semiconductor active layer, the method comprising:
   a step of forming the semiconductor active layer, the step comprising:
   a first step of forming a ZnO film on the gate insulation film or on the substrate;
   a second step of applying an ultraviolet pulsed laser to substantially the entire ZnO film to change a specific resistance value of the ZnO film at a region exposed to the pulsed laser to $10^2$ $\Omega \cdot cm$ or less; and
   a third step of applying oxidation treatment to a portion of the region exposed to the pulsed laser, the portion including the active layer, to change the specific resistance value of the semiconductor active layer at the portion subjected to the oxidation treatment to $10^3$ $\Omega \cdot cm$ or more,
   the first to third steps being carried out in this order.

2. The method for producing a semiconductor device as claimed in claim 1, wherein the ZnO film is formed by a liquid phase method using a material liquid, the material liquid comprising an organic solvent and at least one material selected from the group consisting of an inorganic material, an organic precursor material and an organic-inorganic composite precursor material.

3. The method for producing a semiconductor device as claimed in claim 1, wherein the specific resistance value is changed in the third step to $10^4$ $\Omega \cdot cm$ or more.

4. The method for producing a semiconductor device as claimed in claim 1, wherein the oxidation treatment comprises applying, under the presence of oxygen, at least one treatment selected from the group consisting of oxygen radial treatment and heat treatment carried out at a temperature not higher than 150° C.

5. The method for producing a semiconductor device as claimed in claim 1, wherein the pulsed laser has a pulse half-width of 100 ns or less.

6. The method for producing a semiconductor device as claimed in claim 1, wherein the pulsed laser comprises an excimer laser using any mixed gas selected from the group consisting of ArF, KrF and XeCl.

7. The method for producing a semiconductor device as claimed in claim 1, wherein the substrate comprises a flexible substrate formed of a resin.

8. The method for producing a semiconductor device as claimed in claim 2, wherein the specific resistance value is changed in the third step to $10^4$ $\Omega \cdot cm$ or more.

9. The method for producing a semiconductor device as claimed in claim 2, wherein the oxidation treatment comprises applying, under the presence of oxygen, at least one treatment selected from the group consisting of oxygen radial treatment and heat treatment carried out at a temperature not higher than 150° C.

10. The method for producing a semiconductor device as claimed in claim 3, wherein the oxidation treatment comprises applying, under the presence of oxygen, at least one treatment selected from the group consisting of oxygen radial treatment and heat treatment carried out at a temperature not higher than 150° C.

11. The method for producing a semiconductor device as claimed in claim 4, wherein the oxygen radial treatment comprises UV ozone treatment or plasma treatment.

12. The method for producing a semiconductor device as claimed in claim 8, wherein the oxidation treatment comprises applying, under the presence of oxygen, at least one treatment selected from the group consisting of oxygen radial treatment and heat treatment carried out at a temperature not higher than 150° C.

13. The method for producing a semiconductor device as claimed in claim 9, wherein the oxygen radial treatment comprises UV ozone treatment or plasma treatment.

14. The method for producing a semiconductor device as claimed in claim 10, wherein the oxygen radial treatment comprises UV ozone treatment or plasma treatment.

15. The method for producing a semiconductor device as claimed in claim 12, wherein the oxygen radial treatment comprises UV ozone treatment or plasma treatment.

* * * * *